(12) United States Patent
Tate et al.

(10) Patent No.: US 11,374,304 B2
(45) Date of Patent: Jun. 28, 2022

(54) ANTENNA DEVICE AND CIRCUIT BOARD HAVING THE SAME

(71) Applicant: TDK Corporation, Tokyo (JP)

(72) Inventors: Toshiki Tate, Tokyo (JP); Yutaka Ui, Tokyo (JP); Hisashi Kobuke, Tokyo (JP); Yasumasa Harihara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 49 days.

(21) Appl. No.: 17/096,371

(22) Filed: Nov. 12, 2020

(65) Prior Publication Data

US 2021/0143526 A1    May 13, 2021

(30) Foreign Application Priority Data

Nov. 13, 2019  (JP) .............................. JP2019-205517

(51) Int. Cl.
*H05K 1/02*   (2006.01)
*H01Q 1/22*   (2006.01)
*H05K 1/11*   (2006.01)

(52) U.S. Cl.
CPC ......... *H01Q 1/2283* (2013.01); *H05K 1/0215* (2013.01); *H05K 1/0242* (2013.01); *H05K 1/115* (2013.01)

(58) Field of Classification Search
CPC .............................. H05K 1/0215; H05K 1/115
USPC ...................................................... 174/138 A
See application file for complete search history.

(56) References Cited

U.S. PATENT DOCUMENTS

| | | | | |
|---|---|---|---|---|
| 2005/0230146 | A1* | 10/2005 | Koyama | H05K 1/162 174/262 |
| 2013/0115411 | A1 | 5/2013 | Kimura et al. | |
| 2013/0266758 | A2 | 10/2013 | Kimura et al. | |
| 2014/0145883 | A1* | 5/2014 | Baks | H01L 23/66 343/700 MS |
| 2019/0165475 | A1* | 5/2019 | Shibata | H01Q 9/045 |
| 2019/0198995 | A1* | 6/2019 | Ryoo | H01Q 1/38 |
| 2019/0305432 | A1* | 10/2019 | Kim | H01Q 21/28 |
| 2019/0334250 | A1* | 10/2019 | Kamio | H01Q 21/20 |
| 2020/0021019 | A1* | 1/2020 | Rajagopalan | H01Q 1/2291 |

FOREIGN PATENT DOCUMENTS

| | | |
|---|---|---|
| JP | 2012-029015 A | 2/2012 |
| JP | 2019-004241 A | 1/2019 |

* cited by examiner

*Primary Examiner* — Sherman Ng
(74) *Attorney, Agent, or Firm* — McDermott Will & Emery LLP

(57) ABSTRACT

Disclosed herein is an antenna device that includes: a substrate having a plurality of insulating layers laminated in a z-direction; a first ground pattern formed on a first insulating layer; a first radiating conductor pattern formed on a second insulating layer; a second ground pattern constituted by a first via conductor provided so as to penetrate at least two insulating layers; and a second radiating conductor pattern constituted by a second via conductor provided so as to penetrate at least one insulating layer. The first radiating conductor pattern overlaps the first ground pattern in the z-direction. The second radiating conductor pattern overlaps the second ground pattern in a y-direction.

8 Claims, 11 Drawing Sheets

ANTENNA DEVICE AND CIRCUIT BOARD HAVING THE SAME

BACKGROUND OF THE INVENTION

Field of the Invention

The present invention relates to an antenna device and a circuit board having the same and, more particularly, to an antenna device having a wide communicable angular range and a circuit board having the same.

Description of Related Art

As an antenna device having a wide communicable angular range, one described in JP 2019-004241A is known. The antenna device described in JP 2019-004241A has a flexible substrate having a partially thinned portion, at which the flexible substrate is bent to widen a communicable angular range. However, in this antenna device, a patch conductor pattern is formed on both sides of the bent part, making it difficult to achieve miniaturization.

Further, although not directly relating to an antenna device, JP 2012-029015A proposes a laminated electronic component in which a plurality of laminates of different lamination directions are combined and, thereby, conductor patterns having main surfaces directed in a plurality of directions (z- and x-directions) coexist. It is thought that applying the laminated electronic component described in JP 2012-029015A to an antenna device can achieve an antenna device having a small size and a wide communicable angular range.

However, the combining of the plurality of laminates of different lamination directions in the laminated electronic component described in JP 2012-029015A makes a manufacturing process comparatively complicated. Thus, even when the laminated electronic component described in JP 2012-029015A is applied to an antenna device, it is difficult to manufacture an antenna device having a small size and a wide communicable angular range at low cost.

SUMMARY

It is therefore an object of the present invention to provide an antenna device capable of being manufactured at low cost and having a small size and a wide communicable angular range and a circuit board having such an antenna device.

An antenna device according to the present invention includes: a substrate having a structure in which a plurality of insulating layers whose main surfaces extend in a first direction and in a second direction perpendicular to the first direction are laminated in a third direction perpendicular to both the first and second directions; a first ground pattern formed on the main surface of a first insulating layer included in the plurality of insulating layers; a first radiating conductor pattern formed on the main surface of a second insulating layer included in the plurality of insulating layers and overlapping the first ground pattern in the third direction; a second ground pattern provided penetrating at least two insulating layers included in the plurality of insulating layers in the third direction and constituted by a first via conductor larger in size in the first direction than in the second direction; and a second radiating conductor pattern provided penetrating at least one insulating layer included in the plurality of insulating layers in the third direction, constituted by a second via conductor larger in size in the first direction than in the second direction, and overlapping the second ground pattern in the second direction.

According to the present invention, the first radiating conductor pattern facing the third direction and the second radiating conductor pattern facing the second direction are formed on one substrate, so that an antenna device having a small size and a wide communicable angular range can be provided. In addition, the second radiating conductor pattern and the second ground pattern are constituted by the via conductors larger in size in the first direction than in the second direction, thus eliminating the need to combine a plurality of laminates of different lamination directions. This allows an antenna device having a small size and a wide communicable angular range to be manufactured at low cost.

In the present invention, the substrate may have: a first antenna area positioned on one side in the second direction as viewed from the third direction and including the first ground pattern and first radiating conductor pattern; and a second antenna area positioned on the other side in the second direction as viewed from the third direction and including the second ground pattern and second radiating conductor pattern. This can prevent interference between an antenna constituted by the first radiating conductor pattern and an antenna constituted by the second radiating conductor pattern.

In the present invention, the number of the plurality of insulating layers may be smaller in the first antenna area than in the second antenna area and, accordingly, a recessed part may be formed at a part of the surface of the substrate corresponding to the first antenna area. This can reduce the weight of the antenna device.

The antenna device according to the present invention may further have an IC chip mounted on the recessed part and connected to the first and second radiating conductor patterns. This allows effective use of the recessed part.

The antenna device according to the present invention may further has a first power feeding pattern connecting the IC chip and the first radiating conductor pattern and a second power feeding pattern connecting the IC chip and the second radiating conductor pattern. The first power feeding pattern may include a third via conductor provided penetrating some of the plurality of insulating layers in the third direction and connected to the first radiating conductor pattern through a first opening formed in the first ground pattern, and the second power feeding pattern may include a wiring pattern formed in the main surface of a third insulating layer included in the plurality of insulating layers so as to extend in the second direction and connected to the second radiating conductor pattern through a second opening formed in the second ground pattern. This facilitates power feeding to the first and second radiating conductor patterns.

The antenna device according to the present invention may further have a third ground pattern formed on the main surface of a fourth insulating layer included in the plurality of insulating layers, and a part of the wiring pattern may be sandwiched between the first and third ground patterns. This allows the wiring pattern to be shielded vertically.

In the present invention, the antenna device may have a plurality of the first radiating conductor patterns and a plurality of the second radiating conductor patterns. The first radiating conductor patterns may be arranged in the first direction, and the second radiating conductor patterns may be arranged in the first direction. This makes it possible to control the radiation direction of a beam by phase control.

A circuit board according to the present invention has the above antenna device mounted thereon. By mounting one antenna device according to the present invention on the circuit board, beams can be radiated in two directions. By mounting two antenna devices according to the present invention on the circuit board, beams can be radiated in four directions.

As described above, according to the present invention, there can be provided an antenna device capable of being manufactured at low cost and having a small size and a wide communicable angular range and a circuit board having such an antenna device.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
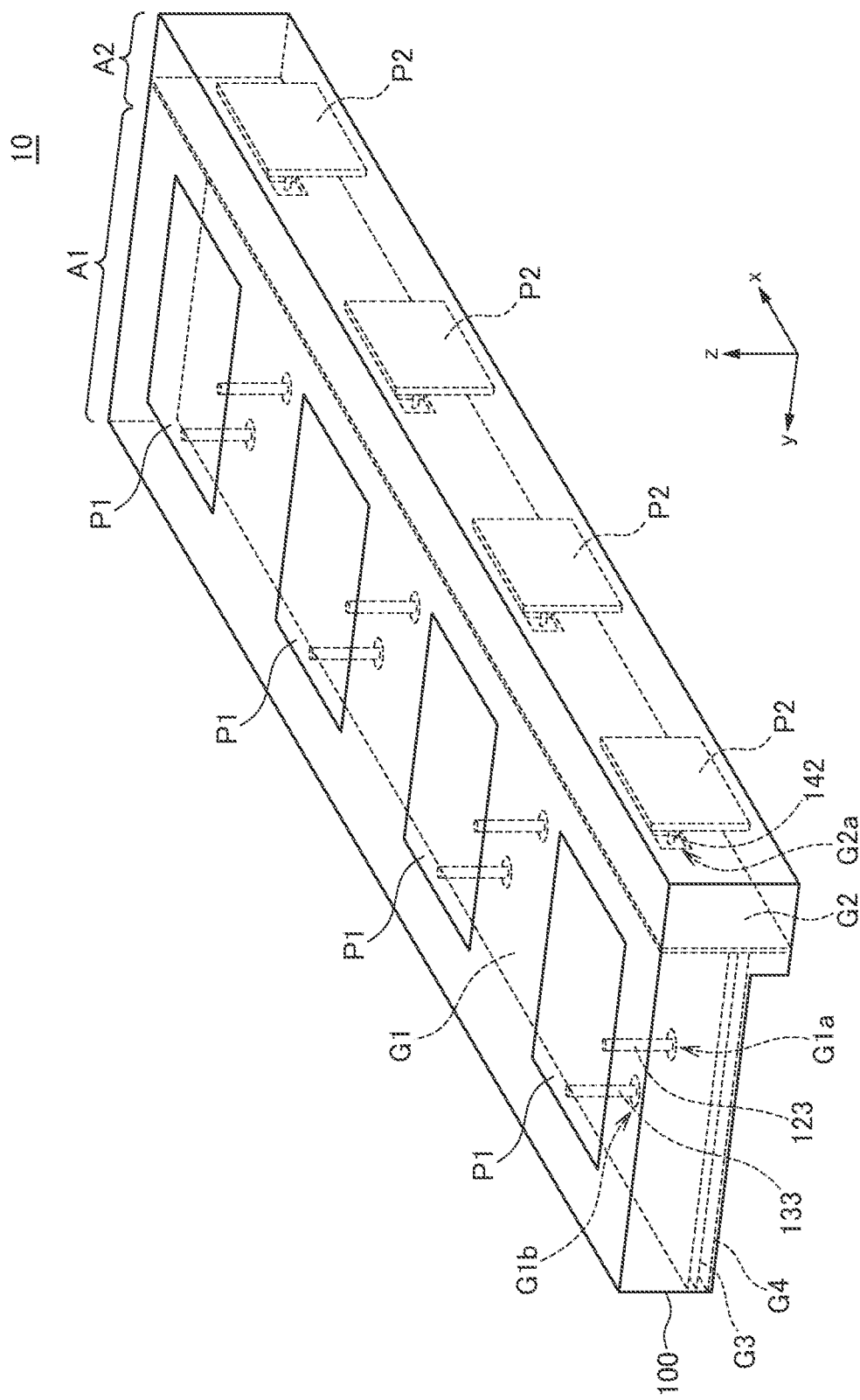
FIG. 1 is a transparent perspective view for explaining the structure of an antenna device 10 according to an embodiment of the present invention.
Figure 2:
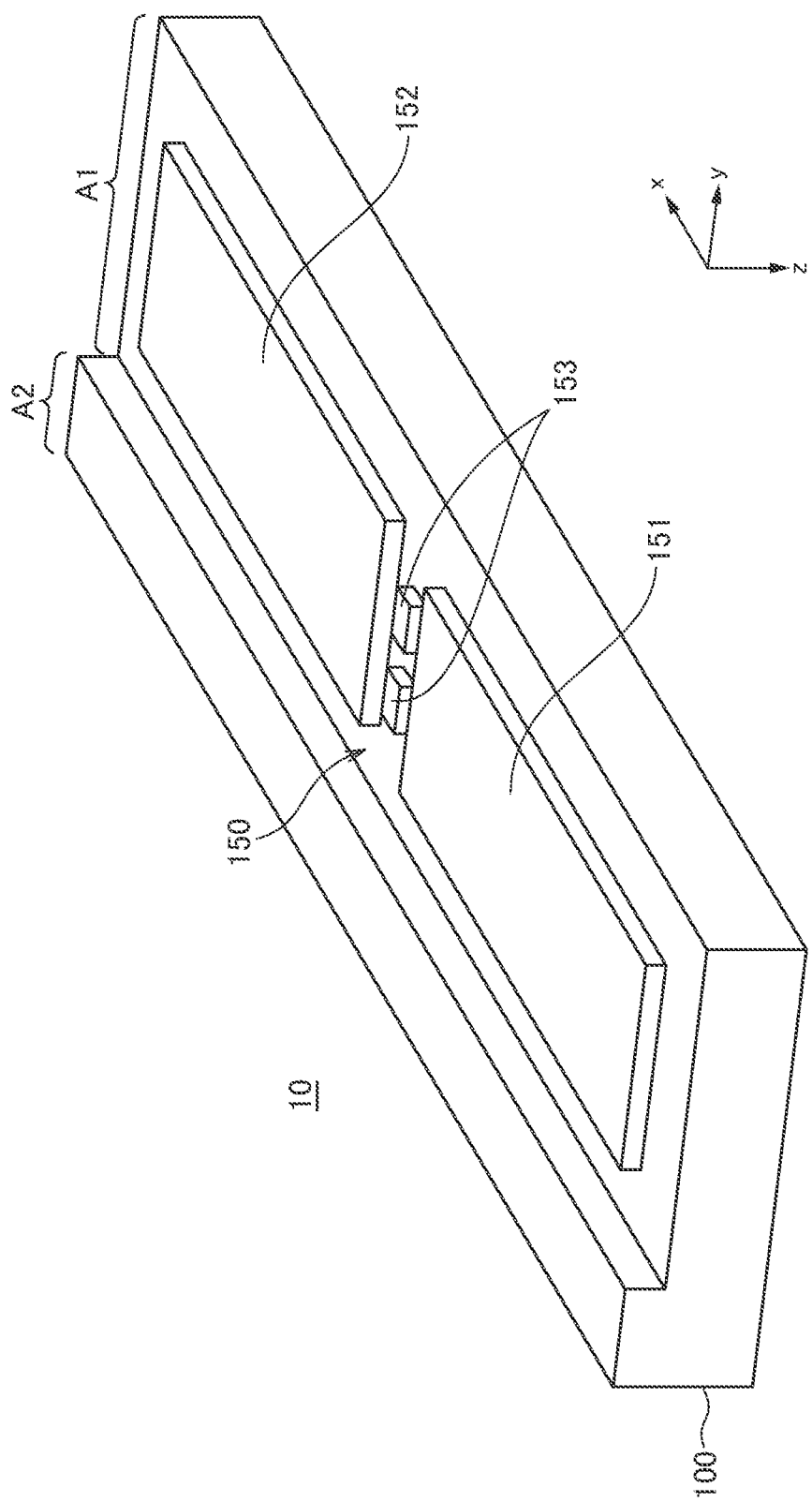
FIG. 2 is a schematic perspective view illustrating the outer appearance of the antenna device 10 as viewed in the direction opposite to that shown in FIG. 1.

FIG. 1 is a transparent perspective view for explaining the structure of an antenna device 10 according to an embodiment of the present invention. FIG. 2 is a schematic perspective view illustrating the outer appearance of the antenna device 10 as viewed in the direction opposite to that shown in FIG. 1.

As illustrated in FIGS. 1 and 2, the antenna device 10 according to the present embodiment includes a substrate 100, conductor patterns formed on the surface of the substrate 100 or inside the substrate 100, and IC chips 151, 152 and an electronic component 153 which are mounted on the substrate 100. The substrate 100 has antenna areas A1 and A2 which are different in position in the y-direction. The antenna area A1 is smaller in thickness than the antenna area A2 in the z-direction, and thus a part of the surface of the substrate 100 corresponding to the antenna area A1 is formed as a recessed part 150, on which the IC chips 151, 152 and electronic component 153 are mounted. The thickness of each of the IC chips 151, 152 and electronic component 153 in the z-direction may be smaller than the difference in thickness between the antenna areas A1 and A2 in the z-direction. In this case, the IC chips 151, 152 and electronic component 153 are positioned lower than the antenna area A2, preventing the IC chips 151, 152 and electronic component 153 from protruding from the substrate 100 in the z-direction. Although two IC chips 151 and 152 are mounted in the present embodiment, there is no particular restriction on the number of IC chips to be mounted on the substrate 100. The electronic component 153 may include a surface-mounted passive component such as an inductor or a capacitor. In the present invention, it is not essential to mount the IC chip or electronic component on the substrate 100.

The antenna area A1 has a ground pattern G1 formed in the xy plane and a patch conductor pattern P1 formed in the xy plane so as to overlap the ground pattern G1 in the z-direction, thereby constituting a first antenna that radiates a beam in the z-direction. The antenna area A2 has a ground pattern G2 formed in the xz plane and a patch conductor pattern P2 formed in the xz plane so as to overlap the ground pattern G2 in the y-direction, thereby constituting a second antenna that radiates a beam in the y-direction. Thus, the antenna device 10 according to the present embodiment can radiate a beam in both the z- and y-directions, thereby achieving communication over a wider angle range. Further, in the present embodiment, four patch conductor patterns P1 are arranged in the x-direction, allowing the beam radiation direction to be inclined in the x-direction with respect to the z-axis by phase control of a power feeding signal. Similarly, in the present embodiment, four patch conductor patterns P2 are arranged in the x-direction, allowing the beam radiation direction to be inclined in the x-direction with respect to the y-axis by phase control of a power feeding signal.

The patch conductor pattern P1 is connected to the IC chip 151 or 152 through a power feeding pattern including via conductors 123 and 133. The ground pattern G1 has formed therein openings G1a and G1b so as to allow the via conductors 123 and 133 to pass therethrough, respectively. Similarly, the patch conductor pattern P2 is connected to the IC chip 151 or 152 through a power feeding pattern including a wiring pattern 142. The ground pattern G2 has formed therein an opening G2a so as to allow the wiring pattern 142 to pass therethrough.

Figure 3:
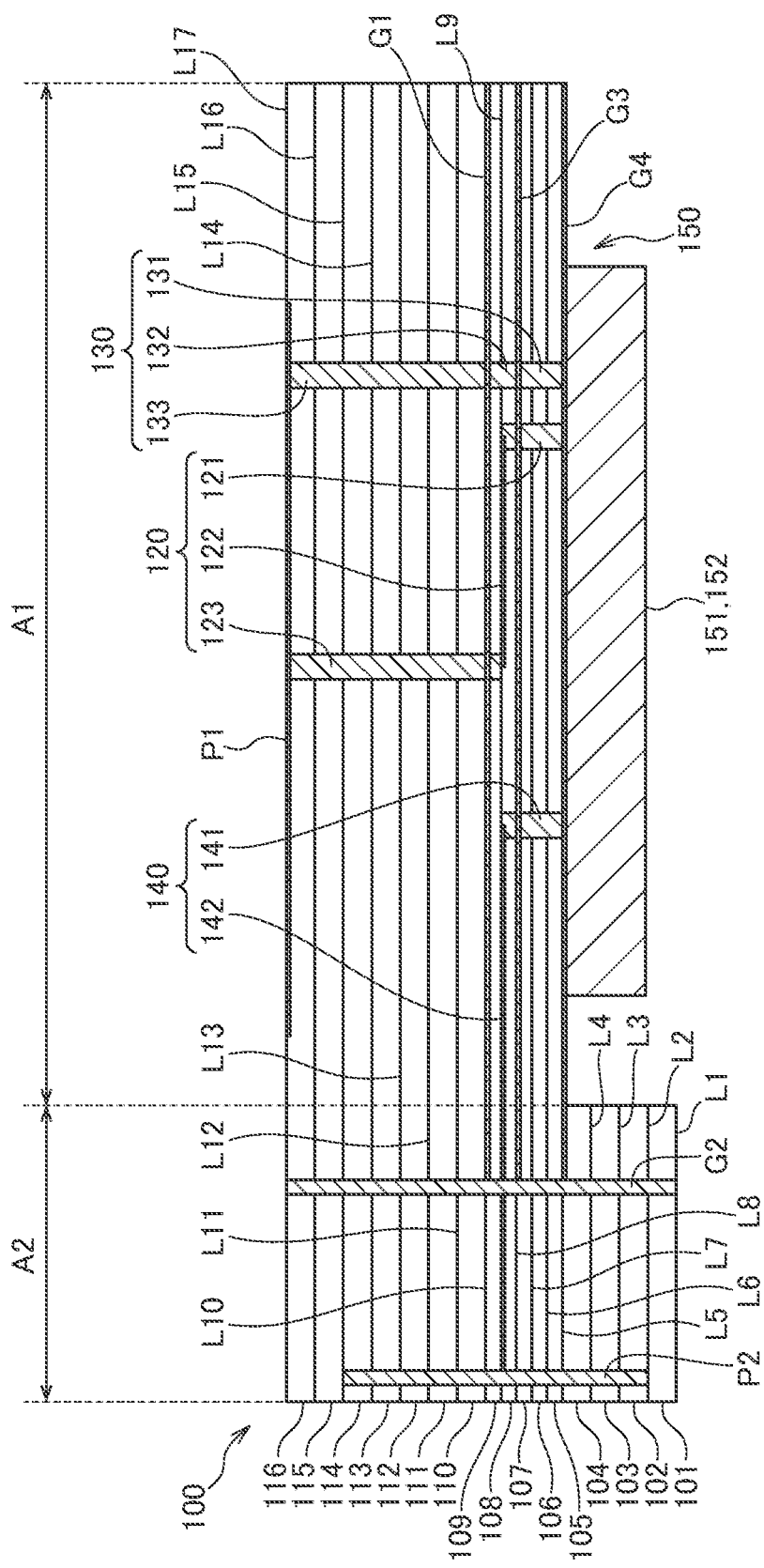
FIG. 3 is a y-z cross-sectional view of the antenna device 10.

FIG. 3 is a y-z cross-sectional view of the antenna device 10 according to the present embodiment.

As illustrated in FIG. 3, the substrate 100 constituting the antenna device 10 according to the present embodiment has 16 insulating layers 101 to 116 which are laminated in the z-direction and on the surfaces of which wiring layers L1 to L17 are positioned. The wiring layers L1 to L17 positioned on the surfaces of the insulating layers 101 to 116 include predetermined conductor patterns and via conductors. The via conductors penetrate predetermined insulating layers in the z-direction. Although there is no particular restriction on the material of the insulating layers 101 to 116, an insulating material having low dielectric loss tangent and excellent in high-frequency characteristics, such as a liquid crystal polymer, is preferably used. The conductor pattern and via conductor are preferably made of a good conductor such as copper.

In the present embodiment, the ground pattern G1 and the patch conductor pattern P1, which are provided in the antenna area A1, are constituted by conductor patterns formed on the wiring layers L10 and L17, respectively, and the ground pattern G2 and the patch conductor pattern P2, which are provided in the antenna area A2, are each constituted by a via conductor formed to penetrate predetermined insulating layers in the lamination direction (z-direction). The via conductors constituting the ground pattern G2 and patch conductor pattern P2 are each larger in size in the x-direction than in the y-direction and thus each extend in the xz plane.

As illustrated in FIG. 3, the patch conductor pattern P1 is connected to the IC chips 151 and 152 through two power feeding patterns 120 and 130. The power feeding pattern 120 includes a via conductor 121 penetrating the insulating layers 105 to 108, a wiring pattern 122 formed on the wiring layer L9, and a via conductor 123 penetrating the insulating layers 109 to 116 and feeds power to a predetermined plane position of the patch conductor pattern P1. The power feeding pattern 130 includes a via conductor 131 penetrating the insulating layers 105 to 108, a wiring pattern 132 formed on the wiring layer L9, and a via conductor 133 penetrating the insulating layers 109 to 116 and feeds power to another plane position of the patch conductor pattern P1. Thus, the patch conductor pattern P1 constitutes a dual polarized antenna.

The patch conductor pattern P2 is connected to the IC chips 151 and 152 through a power feeding pattern 140. The power feeding pattern 140 includes a via conductor 141 penetrating the insulating layers 105 to 108 and a wiring pattern 142 provided on the wiring layer L9 and feeds power to a predetermined plane position of the patch conductor pattern P2.

Further, a ground pattern G3 is formed on the wiring layer L8, and the wiring patterns 122, 132, and 142 formed on the wiring layer L9 are sandwiched between the ground patterns G1 and G3 in the z-direction, with the result that the wiring patterns 122, 132, and 142 are shielded by the ground patterns G1 and G3.

A more detailed explanation will now be given of the pattern shape of the conductor patterns and via conductors formed on and through the wiring layers L1 to L7.

Figure 4:
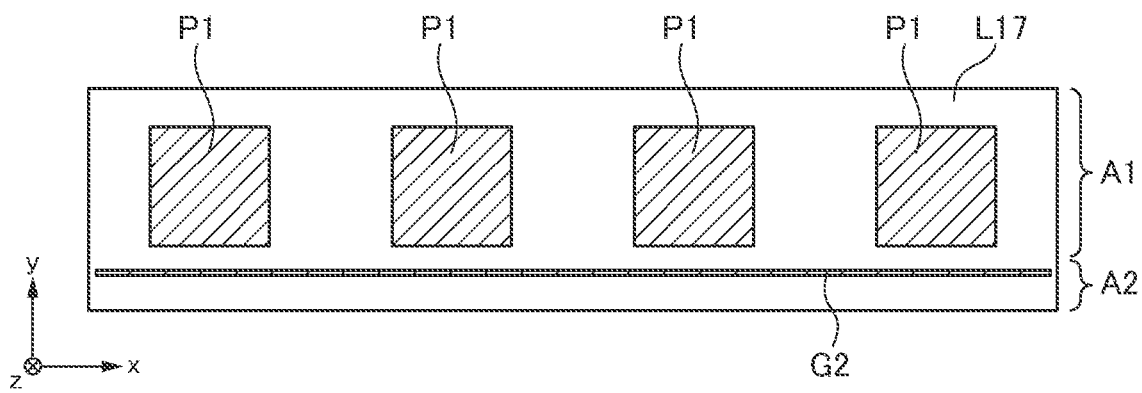
FIG. 4 is a plan view for explaining a pattern shape of a wiring layer L17.

The wiring layer L17, which is the uppermost layer, includes the patch conductor pattern P1 and the ground pattern G2. The wiring layer L17 has a pattern shape as illustrated in FIG. 4, in which four patch conductor patterns P1 are arranged in the x-direction, and the ground pattern G2 extending in the x-direction is provided at a position different in the y-direction from the position of the patch conductor pattern P1.

Figure 5:
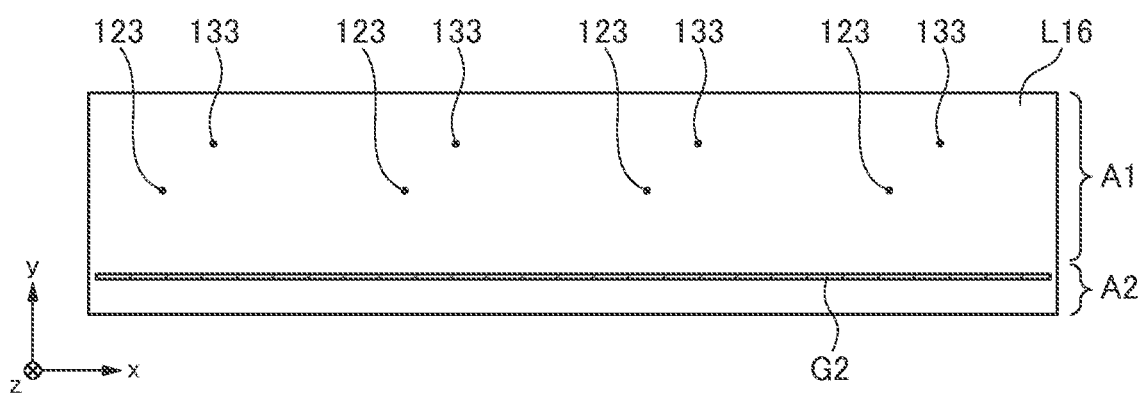
FIG. 5 is a plan view for explaining a pattern shape of a wiring layer L16.
Figure 6:
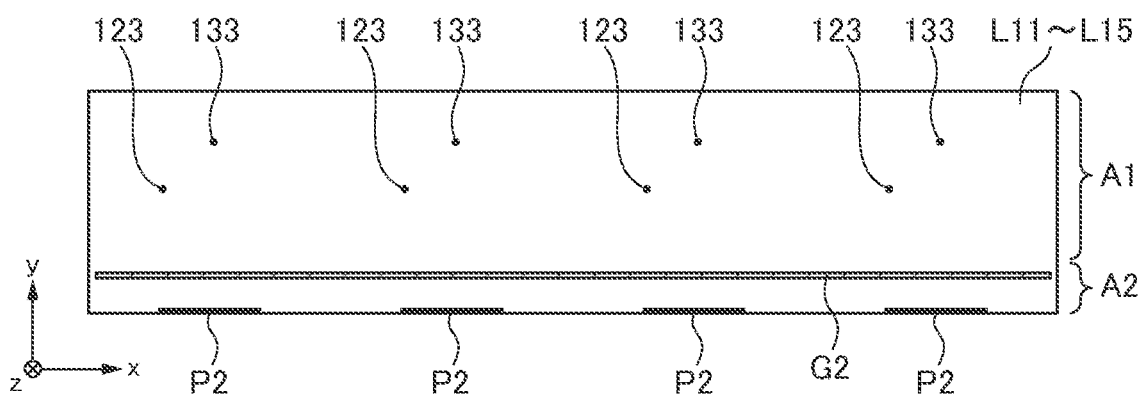
FIG. 6 is a plan view for explaining a pattern shape of each of wiring layers L11 to L15.

As illustrated in FIG. 5, the wiring layer L16 includes the via conductors 123, 133 and ground pattern G2. Further, as illustrated in FIG. 6, the wiring layers L11 to L15 each include the via conductors 123, 133, ground pattern G2, and patch conductor pattern P2. The via conductors 123 and 133 are connected respectively to their corresponding patch conductor patterns P1. The patch conductor patterns P2 are arranged in the x-direction.

Figure 7:
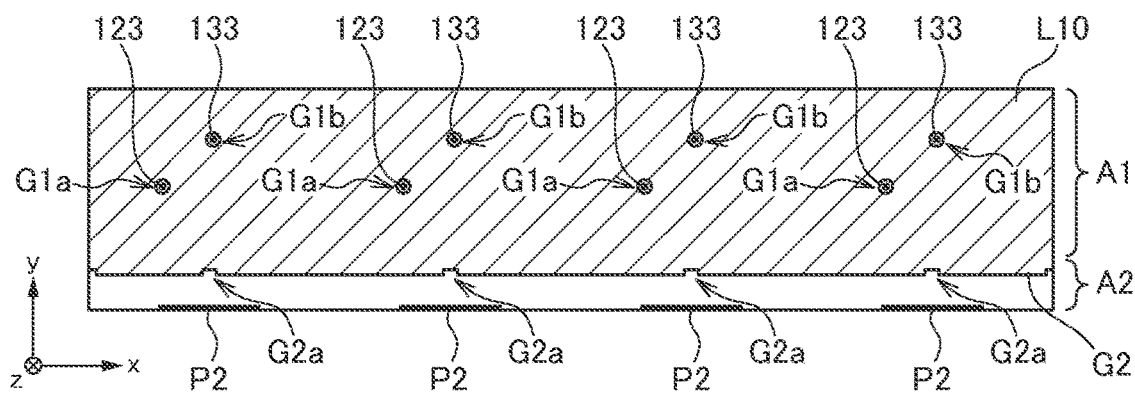
FIG. 7 is a plan view for explaining a pattern shape of a wiring layer L10.

As illustrated in FIG. 7, the wiring layer L10 includes the ground patterns G1, G2, via conductors 123, 133, and patch conductor pattern P2. The end portion of the ground pattern G1 in the y-direction is in contact with the ground pattern G2, whereby the ground patterns G1 and G2 have the same potential. The ground pattern G1 has the openings G1a and G1b, and the via conductors 123 and 133 are disposed in areas inside the openings G1a and G1b, respectively.

Figure 8:
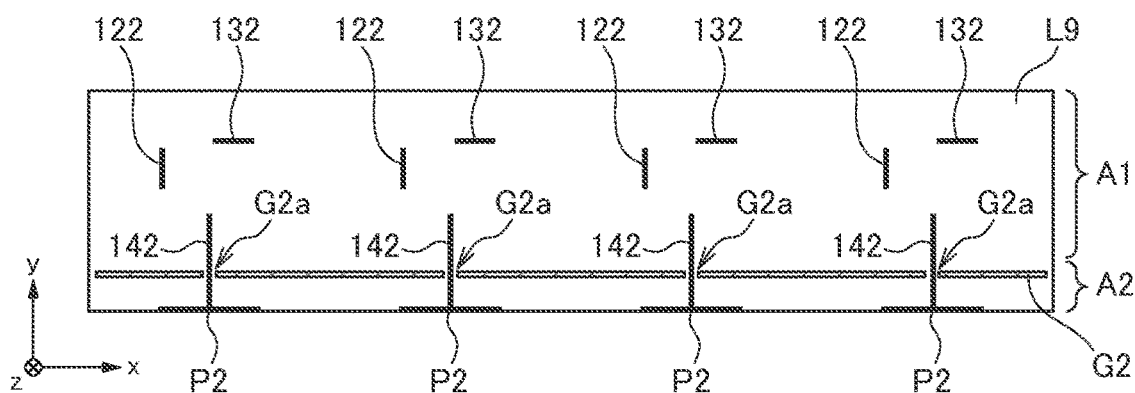
FIG. 8 is a plan view for explaining a pattern shape of a wiring layer L9.

As illustrated in FIG. 8, the wiring layer L9 includes the ground pattern G2, patch conductor pattern P2, and wiring patterns 122, 132, and 142. One end of the wiring pattern 122 is connected to the via conductor 123 formed in the wiring layer L10, and one end of the wiring pattern 132 is connected to the via conductor 133 formed in the wiring layer L10. The ground pattern G2 has the opening G2a, and the wiring pattern 142 extends in the y-direction passing through the opening G2a. The wiring pattern 142 is connected at its one end to the corresponding patch conductor pattern P2.

Figure 9:
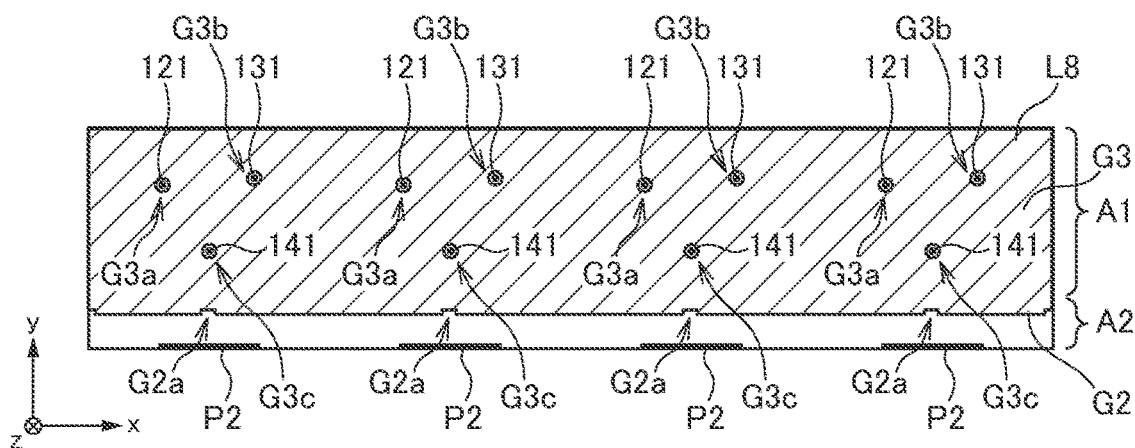
FIG. 9 is a plan view for explaining a pattern shape of a wiring layer L8.

As illustrated in FIG. 9, the wiring layer L8 includes the ground patterns G2, G3, via conductors 121, 131, 141, and patch conductor patterns P2. The end portion of the ground pattern G3 in the y-direction is in contact with the ground pattern G2, whereby the ground patterns G2 and G3 have the same potential. The ground pattern G3 has openings G3a, G3b, and G3c, and the via conductors 121, 131, and 141 are disposed in areas inside the openings G3a, G3b, and G3c, respectively. The via conductors 121, 131, and 141 are connected respectively to the wiring patterns 122, 132, and 142.

Figure 10:
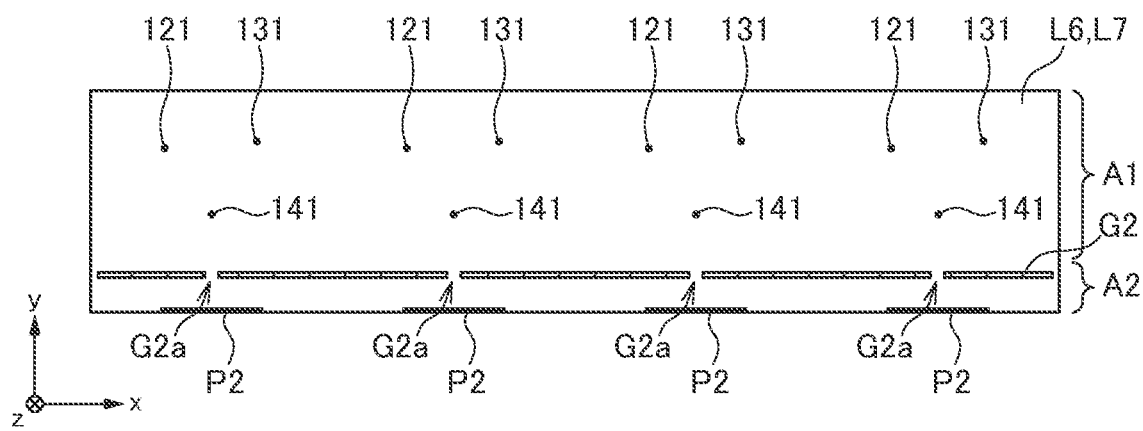
FIG. 10 is a plan view for explaining a pattern shape of each of wiring layers L6 and L7.

As illustrated in FIG. 10, the wiring layers L6 and L7 each include via conductors 121, 131, 141, ground pattern G2, and patch conductor pattern P2. The via conductors 123 and 133 are connected respectively to their corresponding patch conductor patterns P1.

Figure 11:
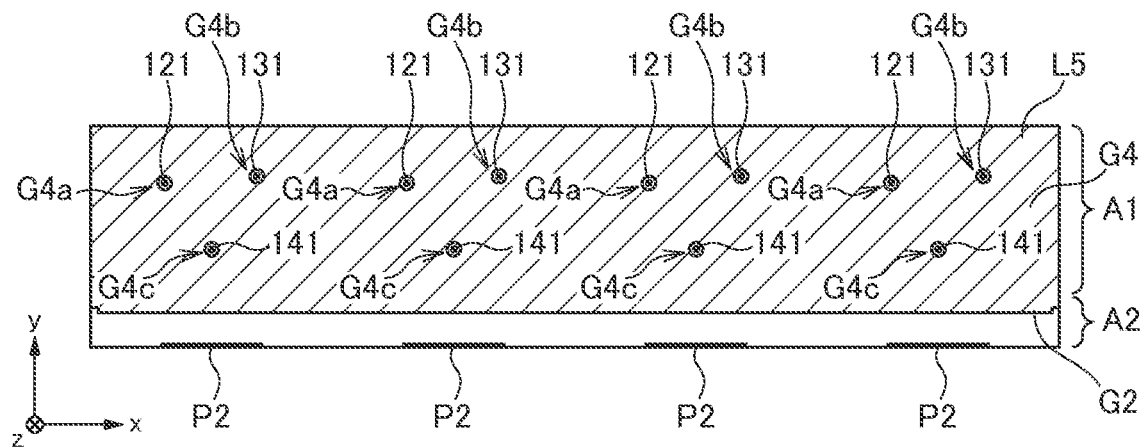
FIG. 11 is a plan view for explaining a pattern shape of a wiring layer L5.

As illustrated in FIG. 11, the wiring layer L5 includes the ground patterns G2, G4, via conductors 121, 131, 141, and patch conductor pattern P2. The end portion of the ground pattern G4 in the y-direction is in contact with the ground pattern G2, whereby the ground patterns G2 and G4 have the same potential. The ground pattern G4 has openings G4a, G4b, and G4c, and the via conductors 121, 131, and 141 are disposed in areas inside the openings G4a, G4b, and G4c, respectively. The wiring layer L5 constitutes the mounting surface on which the IC chips 151 and 152 are mounted.

Figure 12:
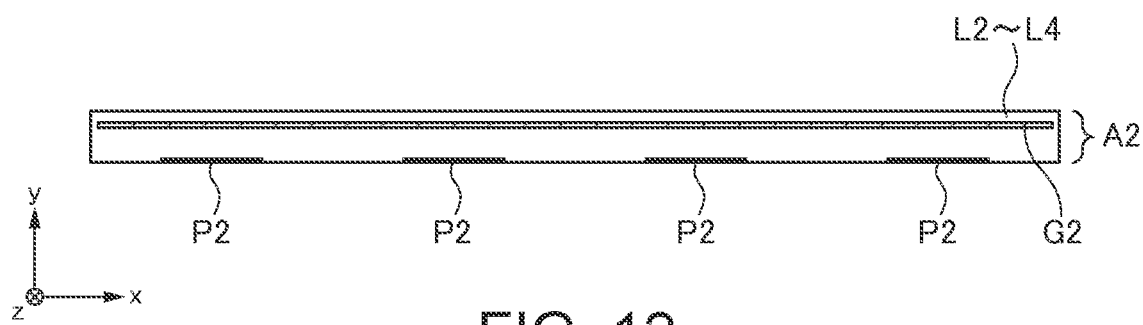
FIG. 12 is a plan view for explaining a pattern shape of each of wiring layers L2 to L4.
Figure 13:
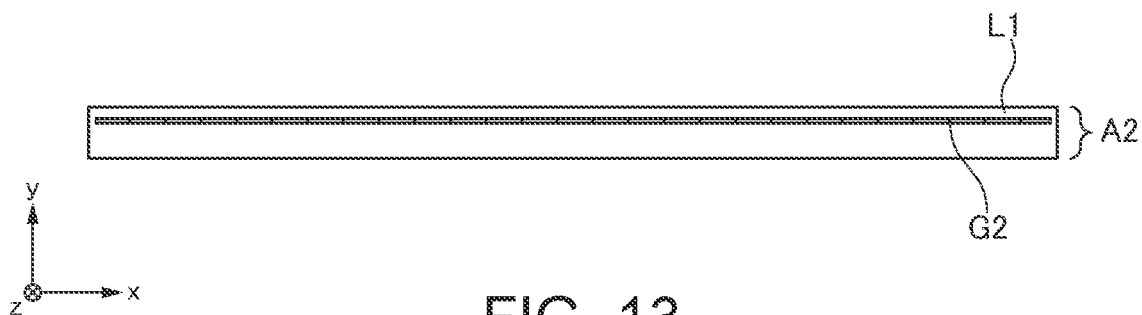
FIG. 13 is a plan view for explaining a pattern shape of a wiring layer L1.

As illustrated in FIGS. 12 and 13, the wiring layers L1 to L4 exist only in the antenna area A2 and do not exist in the antenna area A1. The wiring layers L1 to L4 each include the ground pattern G2, and the wiring layers L2 to L4 each further include the patch conductor pattern P2.

As described above, the ground patterns G1, G3, and G4 are constituted respectively by the xy plane conductor patterns provided on the wiring layers L10, L8, and L5, and the patch conductor pattern P1 is constituted by the xy plane conductor pattern provided on the wiring layer L17. On the other hand, the ground pattern G2 is constituted by the via conductor penetrating the insulating layers 101 to 116 in the z-direction, and the patch conductor pattern P2 is constituted by the via conductor penetrating the insulating layers 102 to 114 in the z-direction. The via conductors constituting the ground pattern G2 and the patch conductor pattern P2 are each larger in size in the x-direction than in the y-direction and thus each extend in the xz plane.

Thus, it is possible to integrate the first antenna that radiates a beam in the z-direction and the second antenna that radiates a beam in the y-direction in one substrate 100 without the need to combine a plurality of laminates of different lamination directions, thus allowing an antenna device 10 having a small size and a wide communicable angular range to be manufactured at low cost.

Figure 14:
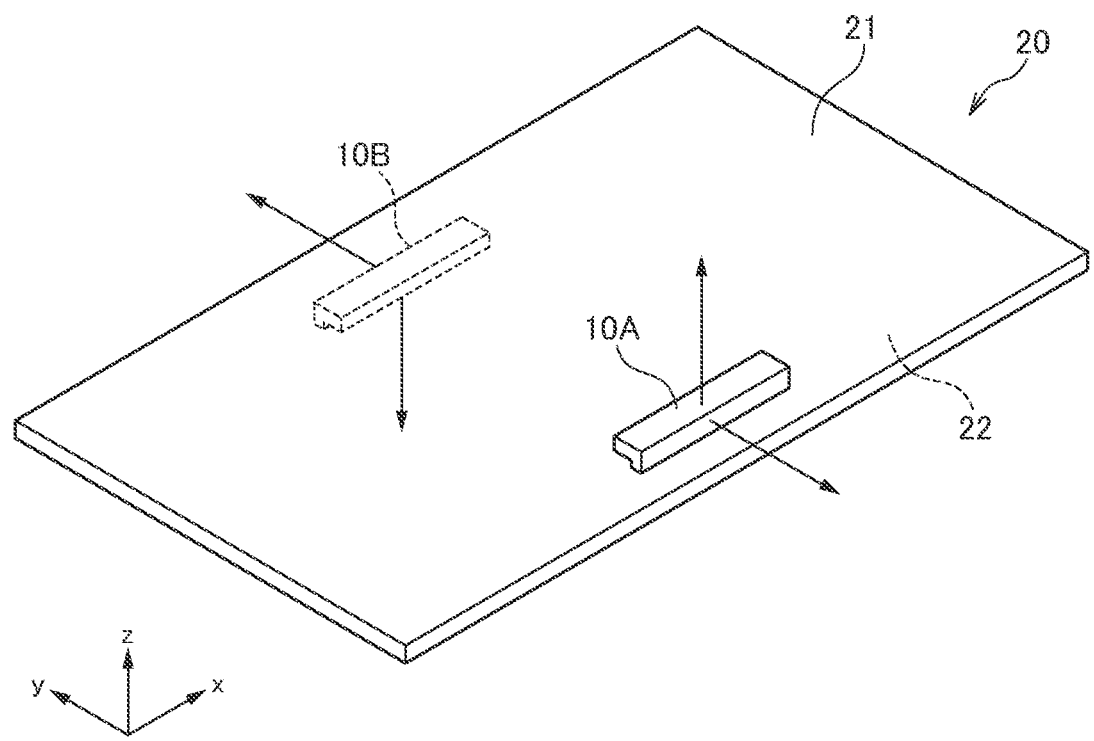
FIG. 14 is a schematic perspective view of a circuit board 20 on which antenna devices 10A and 10B is mounted.

The antenna device 10 according to the present embodiment can be mounted on a circuit board used in mobile information terminals and other devices. In the example of FIG. 14, an antenna device 10A is mounted on one xy surface 21 of a circuit board 20, and an antenna device 10B is mounted on the other xy surface 22 of the circuit board 20. By thus using the two antenna devices 10A and 10B, it is possible to radiate a beam in four directions (positive z-direction, negative z-direction, positive y-direction, and negative y-direction). In this case, the antenna device 10A is mounted in the vicinity of the end portion of the circuit board 20 in the negative y-direction, and the antenna device 10B is mounted in the vicinity of the end portion of the circuit board 20 in the positive y-direction, whereby a communication range can be widened.

There is no particular restriction on the method of manufacturing the antenna device 10. The insulating layers and the conductor patterns may be alternately formed, or the insulating layers 101 to 116 each having the wiring pattern and via conductor may be individually fabricated, followed by lamination thereof. The latter method is especially suitable for a case where a liquid crystal polymer is used as the material of the insulating layers 101 to 116. The following describes the latter method, i.e., a method of individually fabricating the insulating layers 101 to 116.

Figure 15A:
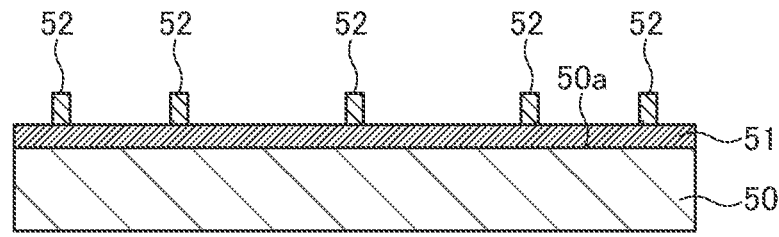
FIGS. 15A to 15D and FIGS. 16A to 16C are process views for explaining a fabrication method of the antenna device 10.

As illustrated in FIG. 15A, a support plate 50 having a conductive film 51 on one main surface 50a is prepared. The support plate 50 has a flat plate shape and may be made of a prepreg material, glass, or silicon. The conductive film 51 functions as a plating seed and may be made of metal such as Cu. The conductive film 51 may be a metal film formed by sputtering or a metal foil such as a Cu foil. Alternatively, an ultrathin copper foil with a carrier serving both as a part of the support plate 50 and the conductive film 51 may be used. Then, a resist 52 is formed on the conductive film 51 and patterned.

Figure 15B:
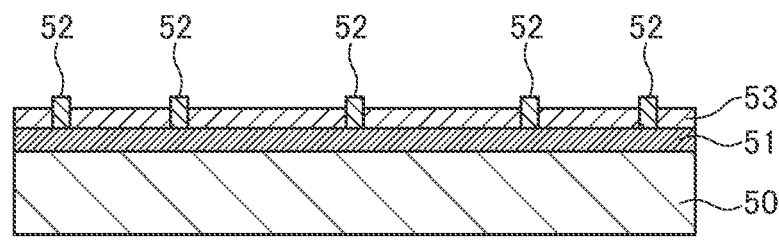
Figure 15C:
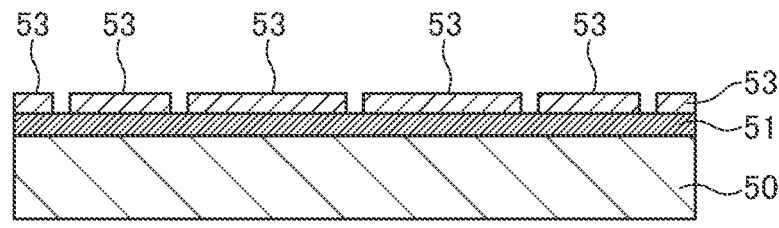
Figure 15D:
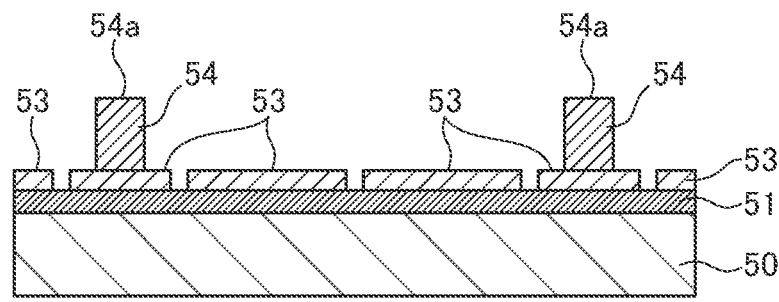

Then, as illustrated in FIG. 15B, electrolytic plating is performed with the conductive film 51 used as a seed to form a wiring pattern 53. After that, as illustrated in FIG. 15C, the resist 52 is removed. Subsequently, as illustrated in FIG. 15D, the same processes (resist patterning, electrolytic plating, and resist removal) as those described using FIGS. 15A to 15C are performed to form a via conductor 54. A layer (e.g., Cr layer, Ti layer) for preventing oxidation of Cu may be formed on the surfaces of the wiring pattern 53 and via conductor 54, especially, on a top surface 54a of the via conductor 54.

Figure 16A:
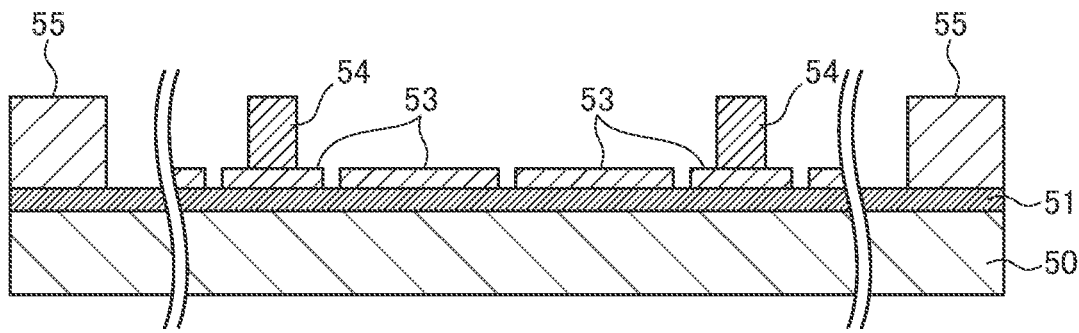
Figure 16B:
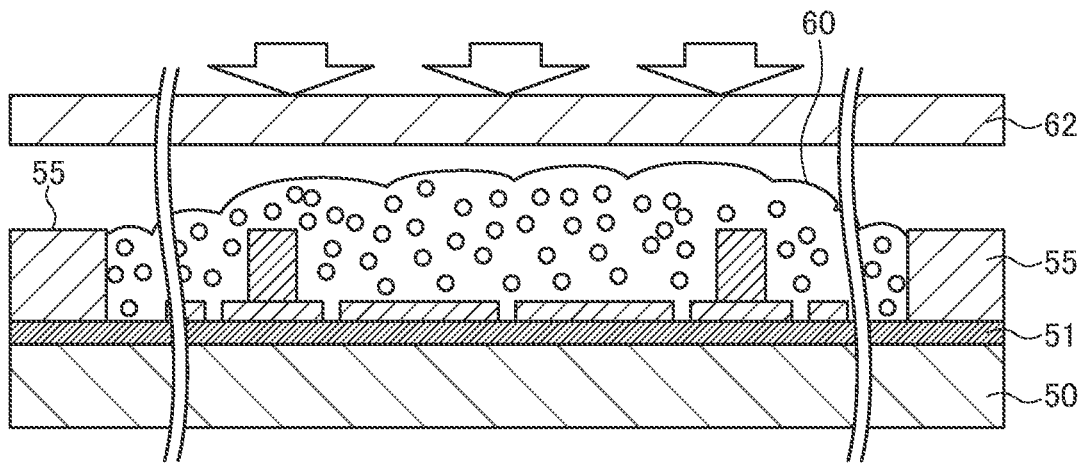

Then, as illustrated in FIG. 16A, a frame body 55 is mounted on the main surface 50a of the support plate 50 and, as illustrated in FIG. 16B, resin powder 60, which is the material of the insulating layers 101 to 116, is supplied inside the frame body 55. Then, a thermal plate 62 is used to perform thermal pressing, followed by cooling. The resin powder 60 is preferably thermoplastic resin powder such as liquid crystal polymer powder. Further, the resin powder 60 is preferably in the form of true-spherical powder so as to make flat the insulating layers 101 to 116 on the main surface 50a of the support plate 50 having a concavo-convex shape due to the existence of the wiring pattern 53 and via conductor 54. In this case, a required amount of resin can be supplied to necessary portions including every corner on the concavo-convex main surface 50a at the time of supplying resin before thermal pressing, whereby the insulating layers 101 to 116 can be formed more efficiently than when resin in film or pellet form is used.

Figure 16C:
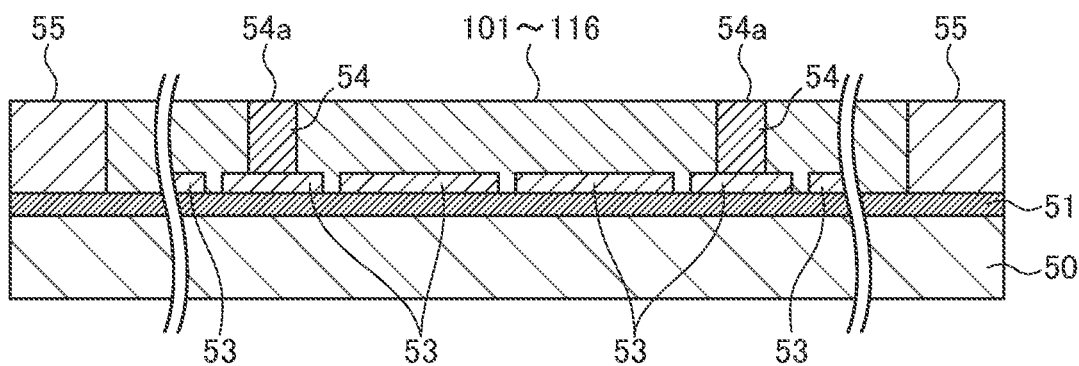

As a result, as illustrated in FIG. 16C, the main surface 50a of the support plate 50 is covered with the insulating layer (101 to 116) inside the frame body 55. Finally, the support plate 50 is removed from the insulating layer (101 to 116) together with the conductive film 51, whereby the insulating layers 101 to 116 each having formed therein the wiring pattern 53 and via conductor 54 are completed. The thus fabricated insulating layers 101 to 116 are collectively laminated by thermal pressing, whereby the above-mentioned antenna device 10 is completed.

It is apparent that the present invention is not limited to the above embodiments, but may be modified and changed without departing from the scope and spirit of the invention.

For example, in the above embodiment, the number of insulating layers (105 to 116) constituting the antenna area A1 is smaller than the number of insulating layers (101 to 116) constituting the antenna area A2 and, accordingly, the recessed part 150 is formed at a part of the surface of the substrate 100 corresponding to the antenna area A1; however, this is not essential in the present invention, and the number of the insulating layers constituting the antenna area A1 and that constituting the area A2 may be the same as each other.

Further, in the above embodiment, the ground pattern G2 is constituted by the via conductor penetrating all the insulating layers 101 to 116 constituting the substrate 100; however, this is not essential in the present invention, and it is sufficient for the via conductor constituting the ground pattern G2 to penetrate at least two insulating layers. Similarly, in the above embodiment, the patch conductor pattern P2 is constituted by the via conductor penetrating 13 insulating layers 102 to 114; however, this is not essential in the present invention, and it is sufficient for the via conductor constituting the patch conductor pattern P2 to penetrate at least one insulating layer.

Figure 17:
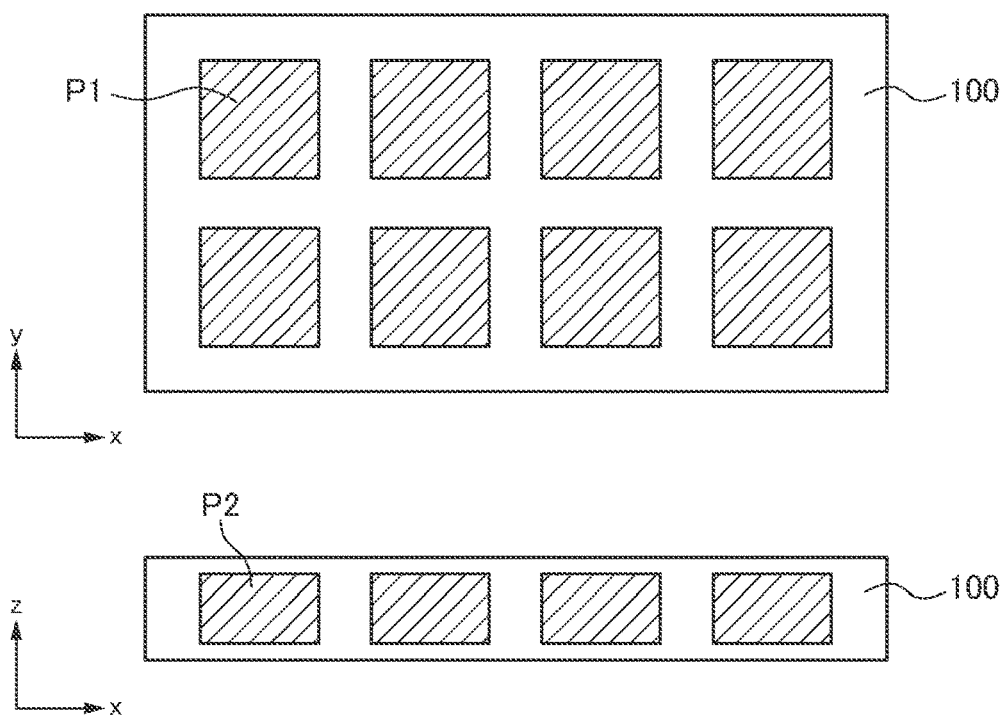
FIG. 17 is a schematic diagram for explaining an arrangement of patch conductor patterns P1 and P2 according to a first modification.
Figure 18:
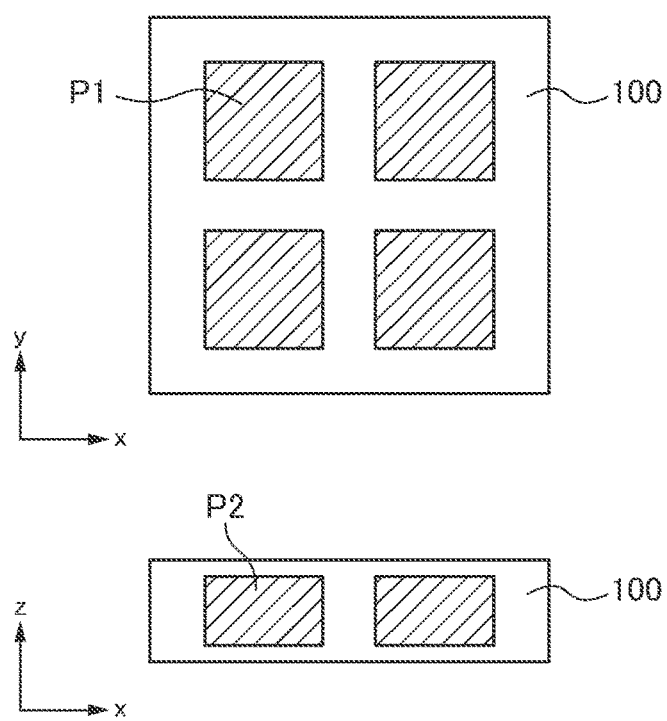
FIG. 18 is a schematic diagram for explaining an arrangement of patch conductor patterns P1 and P2 according to a second modification.
Figure 19:
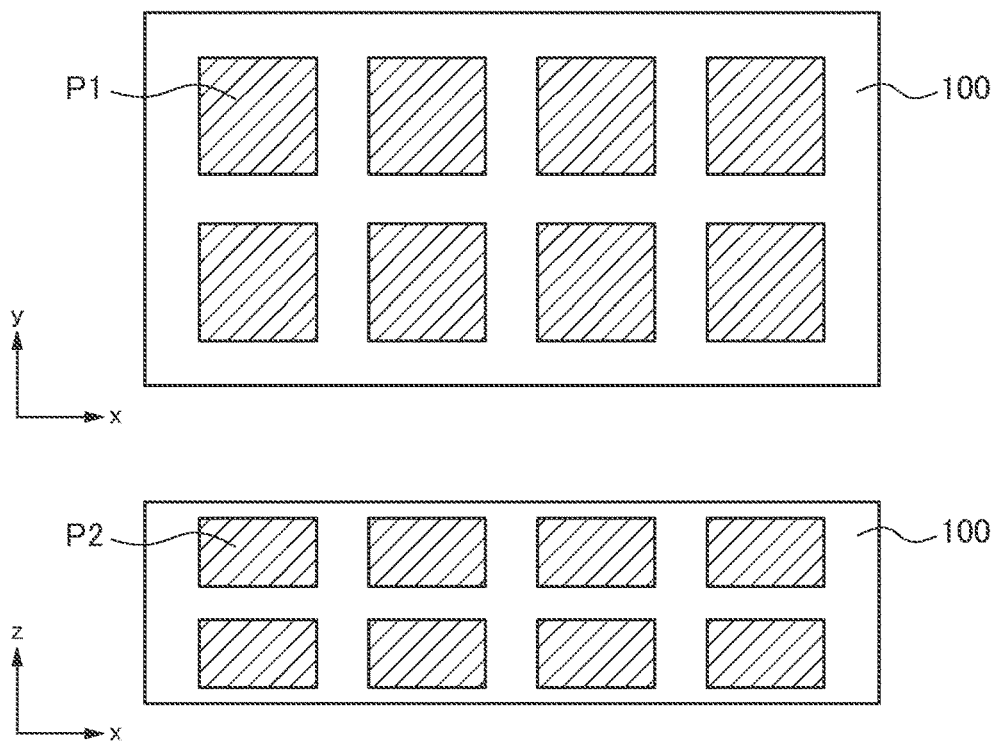
FIG. 19 is a schematic diagram for explaining an arrangement of patch conductor patterns P1 and P2 according to a third modification.
Figure 20:
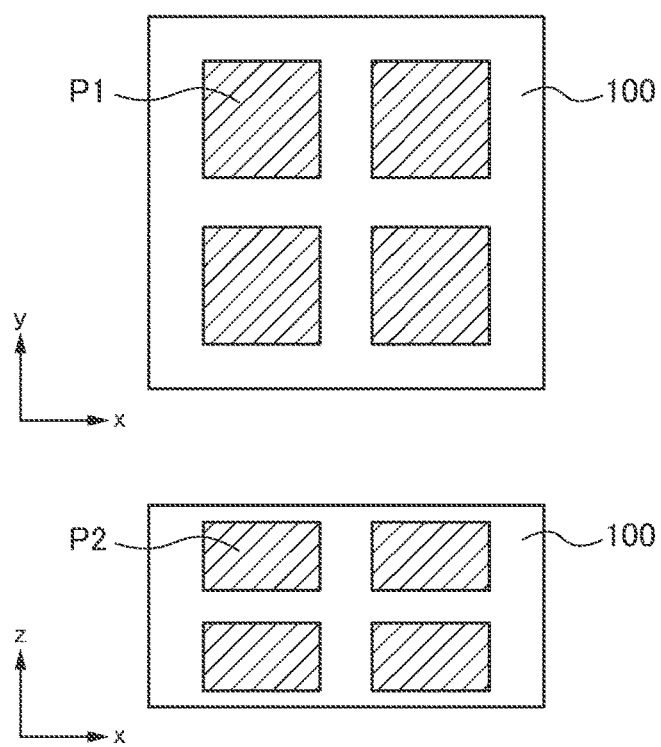
FIG. 20 is a schematic diagram for explaining an arrangement of patch conductor patterns P1 and P2 according to a fourth modification.

Further, in the above embodiment, four patch conductor patterns P1 and four patch conductor patterns P2 are each arranged in one row; however, the arrangement form of the patch conductor patterns P1 and P2 is not limited to this, and four patch conductor pattern P1 may be arranged in two rows (FIG. 17), or two patch conductor patterns P2 may be arranged in two rows (FIG. 18). Further, four patch conductor patterns P1 and four patch conductor patterns P2 may each be arranged in two rows (FIG. 19), or two patch conductor patterns P1 and two patch conductor patterns P2 may each be arranged in two rows (FIG. 20).

Further, although the description has been given taking a patch antenna having the patch conductor patterns P1 and P2 as an example in the above embodiment, the present invention is not limited to this, but can be applied to an antenna device having a radiating conductor pattern of other types.

What is claimed is:
1. An antenna device comprising:
 a substrate having a plurality of insulating layers each having a main surface extending in a first direction and in a second direction perpendicular to the first direction, the plurality of insulating layers being laminated in a third direction perpendicular to the first and second directions;

a first ground pattern formed on the main surface of a first insulating layer included in the plurality of insulating layers;

a first radiating conductor pattern formed on the main surface of a second insulating layer included in the plurality of insulating layers and overlapping the first ground pattern in the third direction;

a second ground pattern constituted by a first via conductor provided so as to penetrate at least two insulating layers included in the plurality of insulating layers in the third direction, the first via conductor being larger in size in the first direction than in the second direction; and a second radiating conductor pattern constituted by a second via conductor provided so as to penetrate at least one insulating layer included in the plurality of insulating layers in the third direction, the second via conductor being larger in size in the first direction than in the second direction, the second radiating conductor pattern overlapping the second ground pattern in the second direction.

2. The antenna device as claimed in claim 1, wherein the substrate includes:

a first antenna area positioned on one side in the second direction as viewed from the third direction and including the first ground pattern and the first radiating conductor pattern; and a second antenna area positioned on other side in the second direction as viewed from the third direction and including the second ground pattern and the second radiating conductor pattern.

3. The antenna device as claimed in claim 2, wherein a number of the plurality of insulating layers is smaller in the first antenna area than in the second antenna area, thereby a recessed part is formed at a part of a surface of the substrate corresponding to the first antenna area.

4. The antenna device as claimed in claim 3, further comprising an IC chip mounted on the recessed part, wherein the IC chip is connected to the first and second radiating conductor patterns.

5. The antenna device as claimed in claim 4, further comprising:

a first power feeding pattern connecting the IC chip and the first radiating conductor pattern; and a second power feeding pattern connecting the IC chip and the second radiating conductor pattern, wherein the first power feeding pattern includes a third via conductor provided so as to penetrate one or more of the plurality of insulating layers in the third direction and connected to the first radiating conductor pattern through a first opening formed in the first ground pattern, and wherein the second power feeding pattern includes a wiring pattern formed on the main surface of a third insulating layer included in the plurality of insulating layers so as to extend in the second direction and connected to the second radiating conductor pattern through a second opening formed in the second ground pattern.

6. The antenna device as claimed in claim 5, further comprising a third ground pattern formed on the main surface of a fourth insulating layer included in the plurality of insulating layers, wherein a part of the wiring pattern is sandwiched between the first and third ground patterns.

7. The antenna device as claimed in claim 1, wherein a plurality of the first radiating conductor patterns are arranged in the first direction, and wherein a plurality of the second radiating conductor patterns are arranged in the first direction.

8. A circuit board on which an antenna device is mounted, wherein the antenna device comprising:

a substrate having a plurality of insulating layers each having a main surface extending in a first direction and in a second direction perpendicular to the first direction, the plurality of insulating layers being laminated in a third direction perpendicular to the first and second directions;

a first ground pattern formed on the main surface of a first insulating layer included in the plurality of insulating layers;

a first radiating conductor pattern formed on the main surface of a second insulating layer included in the plurality of insulating layers and overlapping the first ground pattern in the third direction;

a second ground pattern constituted by a first via conductor provided so as to penetrate at least two insulating layers included in the plurality of insulating layers in the third direction, the first via conductor being larger in size in the first direction than in the second direction; and a second radiating conductor pattern constituted by a second via conductor provided so as to penetrate at least one insulating layer included in the plurality of insulating layers in the third direction, the second via conductor being larger in size in the first direction than in the second direction, the second radiating conductor pattern overlapping the second ground pattern in the second direction.

* * * * *